(12) United States Patent
Rahomäki et al.

(10) Patent No.: US 11,513,268 B2
(45) Date of Patent: Nov. 29, 2022

(54) METHOD OF MANUFACTURING A VARIABLE EFFICIENCY DIFFRACTIVE GRATING AND A DIFFRACTIVE GRATING

(71) Applicant: Dispelix Oy, Espoo (FI)

(72) Inventors: Jussi Rahomäki, Espoo (FI); Ismo Vartiainen, Espoo (FI)

(73) Assignee: Dispelix Oy, Espoo (FI)

( * ) Notice: Subject to any disclaimer, the term of this patent is extended or adjusted under 35 U.S.C. 154(b) by 397 days.

(21) Appl. No.: 16/618,175

(22) PCT Filed: May 18, 2018

(86) PCT No.: PCT/FI2018/050378
§ 371 (c)(1),
(2) Date: Nov. 29, 2019

(87) PCT Pub. No.: WO2018/220269
PCT Pub. Date: Dec. 6, 2018

(65) Prior Publication Data
US 2020/0110205 A1    Apr. 9, 2020

(30) Foreign Application Priority Data

Jun. 2, 2017 (FI) .................................... 20175503

(51) Int. Cl.
*G02B 5/18* (2006.01)
*B29D 11/00* (2006.01)
(Continued)

(52) U.S. Cl.
CPC ...... *G02B 5/1857* (2013.01); *B29D 11/00769* (2013.01); *C23C 16/345* (2013.01);
(Continued)

(58) Field of Classification Search
CPC ................ G02B 5/1828; G02B 5/1866; G02B 2006/12107; G02B 5/1857; B29D 11/00769; C23C 16/45525
(Continued)

(56) References Cited

U.S. PATENT DOCUMENTS 5,113,286 A   5/1992   Morrison
5,907,436 A * 5/1999   Perry ................... G03H 1/0252
                                                      359/569
(Continued)

FOREIGN PATENT DOCUMENTS

CN    104459862 A    3/2015
JP    2000258608 A   9/2000
(Continued)

OTHER PUBLICATIONS

David: Fabrication of stair-case profiles with high aspect ratios for blazed diffractive optical elements. Microelectronic Engineering, 2000, vol. 53.
(Continued)

*Primary Examiner* — Audrey Y Chang
(74) *Attorney, Agent, or Firm* — Laine IP Oy

(57) ABSTRACT

The invention concerns a method of manufacturing a modulated optically diffractive grating and a corresponding grating. The method comprises providing a substrate and manufacturing a plurality of temporary elements onto the substrate, the temporary elements being arranged in a periodic pattern comprising at least two periods having different element characteristics. Next, a first deposition layer is deposited so as to at least partially cover the temporary elements with the first deposition layer and the temporary elements are removed from the substrate in order to form onto the substrate a modulated diffractive grating of first grating elements made of the first deposition layer, the
(Continued)

pattern comprising within each period a plurality of first grating elements and one more gaps between the first grating elements. The invention allows for producing high-quality gratings with locally varying diffraction efficiency.

22 Claims, 2 Drawing Sheets

(51) Int. Cl.
  *C23C 16/34*   (2006.01)
  *C23C 16/40*   (2006.01)
  *C23C 16/455*   (2006.01)
  *G02B 27/00*   (2006.01)
  *G02B 27/01*   (2006.01)

(52) U.S. Cl.
  CPC ...... *C23C 16/405* (2013.01); *C23C 16/45525* (2013.01); *G02B 5/1866* (2013.01); *G02B 27/0081* (2013.01); *G02B 27/0101* (2013.01); *G02B 5/1828* (2013.01)

(58) Field of Classification Search
  USPC .................................. 359/569, 34, 571, 573
  See application file for complete search history.

(56) References Cited

U.S. PATENT DOCUMENTS

| | | | |
|---|---|---|---|
| 6,475,704 B1 | 11/2002 | Iwasaki et al. | |
| 7,972,959 B2 | 7/2011 | Mebarki et al. | |
| 8,765,360 B2* | 7/2014 | Wang | G02B 5/18 |
| | | | 359/569 |
| 2004/0017989 A1 | 1/2004 | So | |
| 2009/0053655 A1* | 2/2009 | Deng | G02B 5/1857 |
| | | | 430/321 |
| 2010/0134534 A1 | 6/2010 | Seesselberg et al. | |
| 2011/0255162 A1 | 10/2011 | Wu et al. | |
| 2013/0027776 A1* | 1/2013 | Wu | G02B 5/1809 |
| | | | 359/572 |
| 2015/0068599 A1 | 3/2015 | Chou et al. | |
| 2017/0315346 A1* | 11/2017 | Tervo | G02B 5/1819 |
| 2020/0066629 A1* | 2/2020 | Schenker | H01L 21/7682 |

FOREIGN PATENT DOCUMENTS

| | | |
|---|---|---|
| JP | 2005517973 A | 6/2005 |
| JP | 2011008172 A | 1/2011 |
| JP | 2011215267 A | 10/2011 |
| JP | 2012013930 A | 1/2012 |
| KR | 2015033561 A | 4/2015 |
| WO | WO 2017091738 A1 | 6/2017 |
| WO | WO 2017176921 A1 | 10/2017 |

OTHER PUBLICATIONS

Jefimovs: A zone doubling technique to produce ultra-high resolution x-ray optics. Physical Review Letters, 2007, vol. 99.

* cited by examiner

METHOD OF MANUFACTURING A VARIABLE EFFICIENCY DIFFRACTIVE GRATING AND A DIFFRACTIVE GRATING

FIELD OF THE INVENTION

The invention relates to manufacturing of micro- and nanostructures for optical purposes. In particular, the invention relates to manufacturing optically diffractive gratings, which can be used for example in display applications, such as near-to-eye displays.

BACKGROUND OF THE INVENTION

Near-to-eye displays (NEDs) and head-up displays (HUDs) typically involve diffractive gratings to produce a viewable image. Gratings are needed as in-coupling gratings, which couple an image from an image source to a wave guide, as out-coupling gratings, which produce the final viewable image for the user, and as exit pupil expanders (EPEs), which increase the size of the displays exit pupil.

The quality and characteristics of the gratings determine the quality of resulting image. In addition to having distinct and consistent grating lines, in advanced applications it is desirable to be able to control the diffraction efficiency of the grating locally. This can be achieved by varying grating line height or fill factor within the grating, i.e. using height or fill factor modulation. To achieve the largest possible efficiency adjustment range, both height and fill factor should be modulated. Thus, there is a need for robust and cost-effective fabrication methods for diffractive gratings in which diffraction efficiency can be freely controlled, and which are applicable for mass production. Moreover, in some cases non-polymeric materials are needed, which adds process complexity in comparison with direct polymer modulation.

There are technologies available for achieving the required grating pattern resolution for optical purposes with inorganic materials. For example, in semiconductor technology, self-aligned double patterning (SADP) discussed e.g. in U.S. Pat. No. 7,972,959 B2, is a well-known technique to enhance patterning resolution for semiconductor components. In x-ray optics manufacturing the method, similar SADP concept (zone frequency doubling), is used to push zone plate line resolution below 10 nm employing electron beam lithography (K, Jefimovs, "*A zone doubling technique to produce ultra-high resolution x-ray optics*" *Physical Review Letters*, 99 (2007)).

Fabrication of height modulated elements is generally done by repeating fabrication cycles in which one height is defined within one cycle. In particular, fabrication of micro- and nanostructures with varying heights on a same substrate is difficult especially in the case of inorganic materials that are difficult to process. This generally requires several fabrication cycles with alignment, where each element height is defined separately during one cycle. This also requires highly optimized and often complicated processing of the material. In order to get vertical side walls in the material, highly anisotropic etching is required in the currently available methods, One known processing method is discussed in C. David, "*Fabrication of stair-case profiles with high aspect ratios for blazed diffractive optical elements*", *Microelectronic Engineering*, 53 (2000). Because of the complexity of the method, the yield of this process is low. Moreover, overlay exposure requires lateral placement accuracy in nanometer level, and any deviations from optimal causes losses in optical performance. Particular challenges are faced when both height modulation and fill factor modulation are desired in order to achieve maximum efficiency adjustment range.

Thus, there is a need for novel industry-scale technologies for height and/or fill factor modulation for diffraction efficiency control.

SUMMARY OF THE INVENTION

It is an aim of the invention to overcome at least some of the abovementioned problems and to provide a novel method for producing modulated patterns of nano- or microelements. A particular aim is to provide a method for producing a height and/or fill factor modulated optically diffractive grating.

One aim is to provide a method that suits for inorganic materials having a high refractive index.

An aim is also to provide a novel modulated grating structure.

The invention is based on the idea of first providing on a substrate with temporary elements, in particular in line formation, in a pattern that includes sections having different element characteristics defining the modulation characteristics of the resulting pattern. After production of the temporary pattern, the final grating material is deposited in two distinct steps between which the temporary elements are removed.

In more detail the present method comprises manufacturing a modulated optically diffractive grating by
  providing a substrate,
  manufacturing a plurality of temporary elements onto the substrate, the temporary elements being arranged in a periodic pattern comprising at least two periods having different element characteristics,
  depositing onto the substrate a first deposition layer so as to at least partially cover the temporary elements with the first deposition layer,
  removing the temporary elements from the substrate in order to form onto the substrate a modulated diffractive grating of first grating elements made of the first deposition layer, the pattern comprising within each period a plurality of first grating elements and one more gaps between the first grating elements, and
  optionally, depositing onto the substrate a second deposition layer in order to at least partially fill said gaps within each period and to form a modulated diffractive grating of second grating elements made of the first and second deposition layers.

In particular, the temporary elements may be line elements, which protrude from the surface of the substrate and result in a one-dimensional line grating to be produced. The line elements may have different line widths and/or line numbers, whereby a grating line fill factor-modulated diffractive pattern is formed. Alternatively, or in addition to that, the line elements may have different line heights, whereby a grating line height-modulated diffractive pattern is formed. Instead of line elements, the temporary elements may be other elements, such as dot elements protruding from the surface of the substrate, whereby there may be periodicity in two dimensions.

The present modulated optically diffractive grating comprises a plurality of grating elements protruding on a substrate, the grating elements being arranged in a periodic pattern. Each period of the pattern comprises at least two first grating elements spaced from each other and having substantially the same dimensional characteristics. Moreover, the grating comprises at least two adjacent periods comprising at two first grating elements with different dimensional characteristics. Using two deposition layers results in a grating comprising within each period additionally at least three second grating elements at least one of which is arranged between the first grating elements and at least two of which are arranged on opposite lateral sides of the first grating elements, the first and second grating elements forming a single unified grating element within each period. The grating comprises at least two adjacent periods comprising unified grating elements with different dimensional characteristics, thus resulting in a modulated grating. The first and second grating elements can be made of the same or different materials.

More specifically, the present invention is characterized by what is stated in the independent claims.

The invention offers significant benefits.

First, the method allows for industry-scale production of high-precision modulated gratings and, in particular simultaneous height and fill factor modulation, which has been difficult previously. This is because the temporary element pattern, which can be easily manufactured using easily processable sacrificial materials, defines the characteristics of the resulting end pattern. The depositions of the final grating material can be made as well-known conformal depositions, such as atomic layer deposition (ALD), chemical vapor deposition (CVD) or physical vapor deposition (PVD), and material removals using well-known etching processes that do not require spatial accuracy. As concerns the accuracy of the deposition of the final material, the method is dependent on the layer thickness control, which for example in the mentioned deposition techniques is inherently good. Thus, the method includes a self-assembly mechanism that ensures high quality pattern structure. The temporary element pattern can be easily produced in sufficient accuracy with e.g. polymer embossing or polymer lithographic techniques, such as nanoimprinting, to include e.g. lines of different heights or widths, and the remaining steps provide a predictable result.

Second, the method allows for using materials that are difficult to process, in particular inorganic materials having high refractive indices (e.g. $n>1.7$ and even $n>2.0$). Examples include oxide or nitride materials, such as $TiO_2$, $Si_3N_4$, and $HfO_2$. There are many precursor materials available that suit for ALD, CVD or PVD methods, for example, and result in inorganic structures suitable for optical diffractive gratings. High-n gratings are required for example in diffractive display applications for ensuring coupling of light between a waveguide substrate and the grating. By means of the invention, it is possible to use higher refractive index substrates, such as glass substrates with higher optical performance compared with e.g. polymeric substrates.

The dependent claims are directed to selected embodiments of the invention.

In some embodiments, at least one of the first and second deposition layers, preferably both layers, is a conformal layer. This ensures high-quality end product with predictable optical properties.

In some embodiments, the method comprises anisotropically removing, such as dry etching, an even thickness of the first deposition layer after its conformal deposition in order to expose the temporary elements before their removal.

The temporary element can be made of first etchable material and the deposition layer or layers using one or more second materials with which the first material is etch selective. Thus, the first material is a sacrificial material that is absent in the final product but required to determine the final modulation characteristics. The second material or set of second materials comprises typically inorganic material or materials that form the grating elements of the final grating structure. The grating elements can be formed in one or two deposition rounds. It should be noted that if two rounds are used, the same or different materials may be used in the rounds. Thus, although typically the same material is used and the grating elements consist of one material only, they may also consist of a composite of materials.

In some embodiments, the deposition of the second deposition layer comprises entirely filling the gaps between first grating elements formed by the first deposition round and the removal of the temporary elements. This provides an end product with a single unified or even unitary grating element in each period. After the second deposition, an even thickness of the second deposition layer can be removed in order to expose the substrate from regions between the unified grating elements.

Next, selected embodiments and advantages of the invention are discussed in more detail with reference to the attached drawings.

DETAILED DESCRIPTION OF EMBODIMENTS

Definitions

Figure 1A:
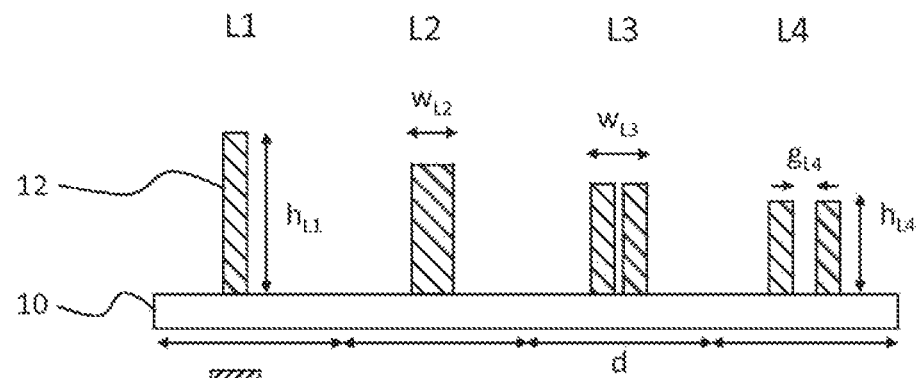
FIGS. 1A-1F illustrate, step by step, in cross-sectional views of a structure produced with an exemplary method according to one embodiment of the invention.

The term "element" herein means any solid micro- or nanoscale feature rising above the substrate surface and capable of serving, when arranged in a periodic structure, as an elementary block of a diffractive pattern or its intermediate product. A "temporary element" or "sacrificial element" is an element, which is at least partly removed during the process. "Element characteristics" covers the geometry of elements within each period, in particular element dimensions and number of sub-elements within each period.

The term "line element" or "line" herein refers to an elongated element forming, or used as an intermediate feature to form, the present pattern. Typically, in a diffractive pattern for display applications, a line is a straight ridge having a desired cross-sectional general shape, such as a rectangular or triangular shape. Line elements are typically used in one-dimensional gratings (linear gratings). "Line characteristics" cover line shape, line width, line height, number of sub-lines and their combinations.

The term "fill factor" refers to the proportion of grating structure material to surrounding material (e.g. air or other solid material) within a grating period. In the typical case of rectangular grating lines, this equals to the proportion of line width to period width. Consequently, "fill factor modulation" refers to variation of fill factor in the lateral dimensions of the grating, i.e. between periods of the periodic structure.

Likewise, "height modulation" refers to variation of element height in the normal direction of the grating. For example, in the case of line elements, element height is the distance between the top of a line (ridge top) and neighboring pit (bottom of the groove).

"Conformal deposition" refers to a deposition technique that is capable of producing a conformal material layer, i.e. a layer having an even thickness on all free surfaces of the underlying structure.

Description of Selected Embodiments

The following description provides examples on how to achieve diffraction efficiency modulation of diffraction gratings by self-assembly patterning according to selected embodiments of the invention. Manufacturing of one-dimensional gratings using line elements is used as an example. However, it is possible to manufacture also two-dimensional gratings having other kinds of elements that allow for periodicity in two dimensions using the present method.

In general, the exemplary method described herein in detail provides feasible means to fabricate micro- and nano-structures with varying element height and till factor using any desired material that is compliant with the chosen deposition method. The method is based on conformal coating on a mold with varying element heights and element density, fabricated in or replicated to a sacrificial material. The excess material on top of the mold is removed by dry or wet etching methods, followed by removal of the sacrificial material. For further fill factor modulation, another deposition-etch cycle is performed. The height and width of the elements is directly defined by height of the sacrificial elements. The method allows for simultaneously combining grating factor and element height modulation for diffraction efficiency control.

Next, the method is described in detail with reference to FIGS. 1A-1F.

Sacrificial Layer

In the first step illustrated by FIG. 1A, a plurality of temporary lines 12 are manufactured on a substrate 10. The temporary lines 12 are made of sacrificial material that can be removed by etching in a later stage of the process. Herein four temporary lines or line pairs L1-L4, one in each grating period d, are shown. The lines or line pairs have a height h and width w, which, herein are all different between different periods in order to exemplify the line formation in different situations. That is, for example the height of line L1, $h_{L1}$, differs from the height of line L4, $h_{L4}$, and the width of line L2, $w_{L2}$, differs from that of line L3, $w_{L3}$. Generally speaking, there are at least two periods having non-similar element configuration in terms of element shape (line cross-section, width and/or height) and/or number of elements within the period.

The temporary lines can be manufactured, by lithographic techniques, such as nanoimprinting lithography, photo or electron beam lithography, or, for example, by embossing, which are known in the art per se.

As a result of this step, a modulated pattern with one or more temporary lines within each grating period d is formed.

In practical applications, there may be provided for example two or more, in particular four or more, such as ten or more, types of different kind of zones formed of periods having different temporary element characteristics in each zone. This produces a grating with a corresponding number of distinct segments having different diffraction efficiencies determined by the element characteristics within each zone. Alternatively, the characteristics of the temporary elements, and therefore the modulation of the final grating, may change according to a continuous gradient, i.e., continuous modulation instead of distinct segmentation.

First Final Material Layer Deposition

Figure 1B:
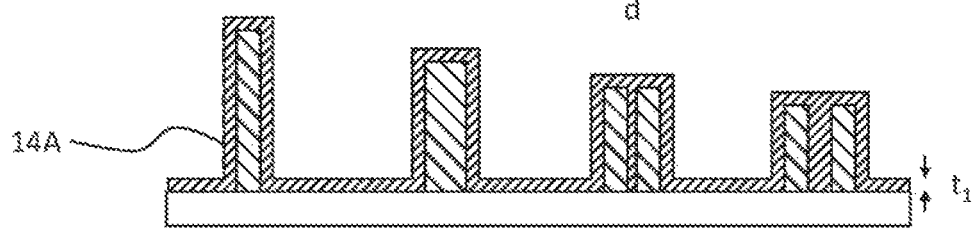

In the next step illustrated by FIG. 1B, a conformal layer 14A of thickness $t_1$ and of desired material that becomes part of the final grating, is deposited on the temporary lines 12. The benefit of conformal coating is that gaps between temporary lines ("first gaps") having width g of $2t_1$ or less are always filled, irrespective of the gap height. In some embodiments, any gaps between lines within any single period are entirely filled, while maintaining the gaps between elements of different periods. However, it is also possible that a gap having a width of $2t_2$ or less is left between lines of any single period and the gap is then filled in during the second deposition round Suitable technologies for conformal deposition include ALD, CVD and PVD methods.

Preparation for Removal of the Sacrificial Layer

Figure 1C:
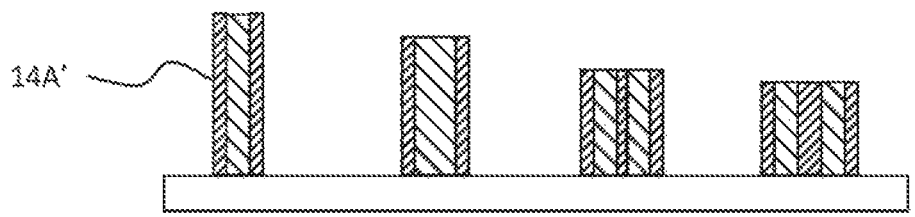

In the next step illustrated by FIG. 1C, the top of a line ("line cap") and the bottom of a groove are etched down until the sacrificial layer and the substrate are reached Intermediate elements 14A' of the final material on the sides of the temporary lines 12 remain in place. This step prepares the product for the next step where the sacrificial layer is removed.

Any anisotropic etching technique suitable for the final material chosen can be used in this step Typically, the technique is selective with respect to the sacrificial layer and the substrate material and removes vertically only parts of the conformal layer 14A. A dry etching technique is preferably used.

Removal of Sacrificial Layer

Figure 1D:
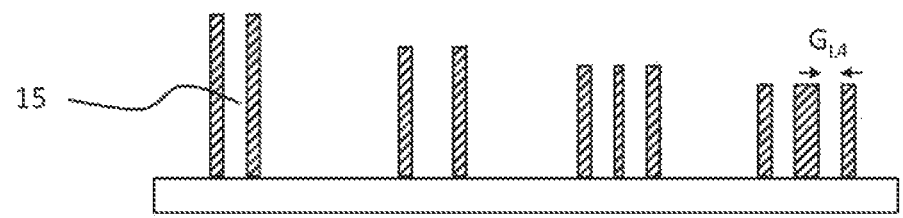

In the next step illustrated by FIG. 1D, the sacrificial layer, i.e. the temporary lines 12 remaining between the intermediate lines 14A', is removed and corresponding gaps 15 ("second gaps") of width G are formed. At this point the fill ratio of the intermediate grating structure is defined by number of lines per period and layer thickness deposited.

Removal can be carried out by a suitable wet or dry etching process having the required selectivity for the materials chosen.

Second Final Material Layer Deposition

Figure 1E:
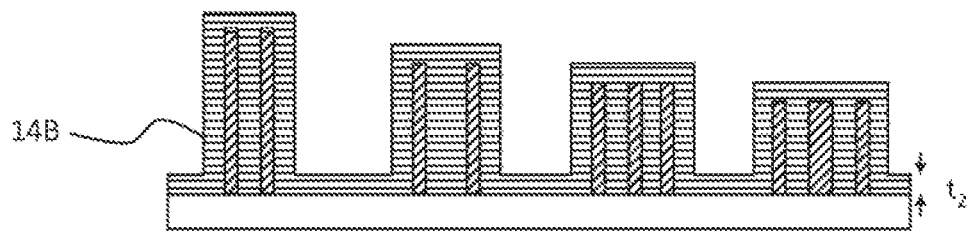

In the next step illustrated by FIG. 1E, a conformal layer 14B of thickness $t_2$ and of desired material that becomes part of the final grating, typically the same as that of layer 14A, is deposited on the intermediate lines 14A' in order to fill gaps 15 Conformal deposition ensures that all gaps between intermediate lines 14A' with a width G of $2t_2$ or less are always filled, irrespective of the gap height. This step further increases the fill ratio of the product.

After this step, a grating with unitary lines entirely formed by e intermediate lines 14A' and the second conformal layer 14B within each period d is formed. The grating is usable as such as a diffractive grating, although in typical cases parts of the second layer at the bottom of grooves between the lines is removed. It should be noted that if the same material is used for both deposition rounds, each line of the final structure is made of single material only, although in FIGS. 1E and 1F the corresponding layers are shown with different fillings.

The second deposition round can be carried out using the same method as that used in the first round.

Finalization of the Grating

Figure 1F:
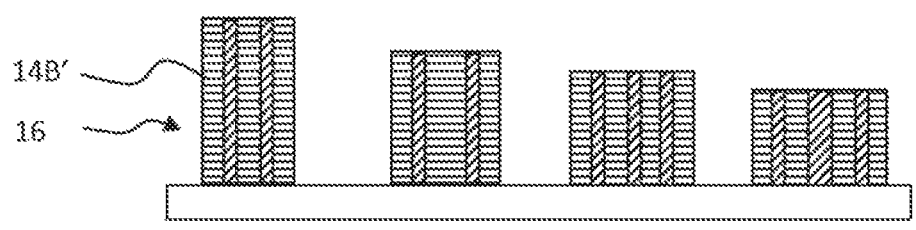

In the next optional step illustrated by FIG. 1F, parts of the second layer 14B at the bottom of grooves between the lines is removed in order to produce distinct grating lines. This can again be achieved by anisotropically etching, preferably using a dry etching process, down to the second layer 14B until the substrate 10 is reached. As a result, final grating lines 16 positioned separately on the substrate 10 are produced.

The fill ratio of the final structure is completely defined by the period d, widths w of the temporary lines or line pairs and thicknesses $t_1$ and $t_2$ of the final material depositions. If the temporary lines had different heights, the same height difference is produced also on the final lines 16. Thus, the modulation of the sacrificial layer determines the modulation of the final grating. The requirements of the processing of the coating material are relaxed because the processing is only used for excess material removal and high anisotropy is not required.

General Considerations and Variations

The final material may be a compound of inorganic materials, in particular a compound which forms an optically transparent material, such as an oxide or nitride compounds. In particular, the final material may comprise material whose index of refraction is 2.0 more, such as 2.2 or more. The material can be e.g. example $TiO_2$, $Si_3N_4$ or $HfO_2$.

The substrate 10 is preferably optically transparent, such as a glass substrate or polymer substrate. Transparent herein means transmittance higher than 50%, in particular higher than 95%. For display applications it is preferred that the substrate is capable of serving as a wave guide for visible optical wavelengths (i.e. as a light guide). The substrate can be planar or curved.

In typical embodiments, the final material has an index of refraction higher than that of the substrate material. This allows for the light travelling in the substrate via total internal reflections to exit the substrate at the location of the grating and the diffraction to take place. For example, the index of refraction of the substrate can be less than 2.0 and the index of refraction of the grating material more than 2.0.

The present invention can be used to manufacture gratings for display applications, such as wearable display applications, for example virtual reality or augmented reality glasses. In these applications, the area of the pattern manufactured is typically at least 1 cm², such as 2-500 cm².

The diffractive grating may be e.g. an out-coupling grating, an in-coupling grating or an exit pupil expander (EPE) of a near-to-eye display (NED) or head-up display (HUD).

The period of the pattern is typically 10 μm or less, in particular 1 μm or less, such as 200-800 nm. It should be noted that in addition to constant-period gratings, the invention can also be used to produce period-modulated gratings. That is, the period does not need to be constant in the lateral dimension of the grating.

If needed, the grating can be embedded in an optical structure, i.e. covered or coated with one or more additional layers.

Figure 2A:
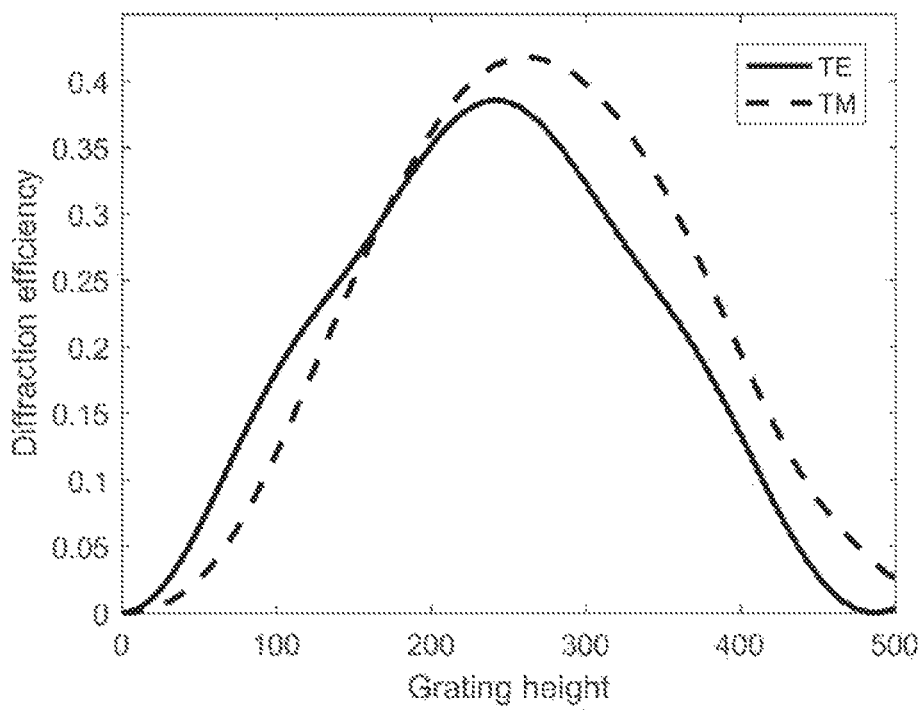
FIG. 2A shows an example how diffraction efficiency of the first transmission order of a binary ID grating changes as a function of the grating height.
Figure 2B:
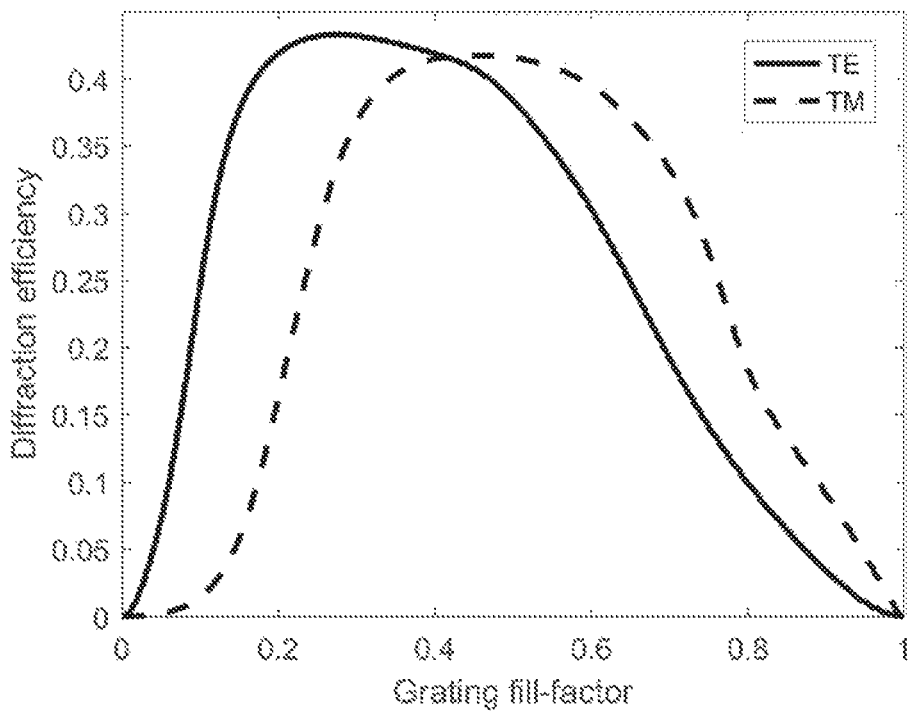
FIG. 2B shows an example how diffraction efficiency of the first transmission order of a ID grating changes as a function of the grating fill-factor.

FIGS. 2A and 2B show how the diffraction efficiency of the first transmission order of a dielectric binary grating can be modulated using height and fill-factor modulation. Numerical results were obtained with the Fourier modal method (also known as rigorous coupled wave analysis). The binary grating resides on an interface between air and a glass substrate having refractive index of 2.0, the grating period is 500 nm, fill factor 0.5, and the grating is made of the same material as the substrate. The grating is illuminated with a plane wave with 450 nm free space wavelength at normal incidence. Results are shown for both transverse electric (TE) and transverse magnetic polarizations (TM). In FIG. 2A, the grating fill factor is 0.5 and in FIG. 2B, the grating height is 250 nm.

CITATIONS LIST

Patent Literature

U.S. Pat. No. 7,972,959 B2

Non-Patent Literature

K. Jefimovs, "A zone doubling technique to produce ultra-high resolution x-ray optics" Physical Review Letters, 99 (2007)

C. David, "Fabrication of stair-case profiles with high aspect ratios for blazed diffractive optical elements", Microelectronic Engineering, 53 (2000).

The invention claimed is:

1. A method for manufacturing a modulated optically diffractive grating, wherein the method comprises:
   the step of providing a substrate,
   the step of manufacturing a plurality of temporary elements onto the substrate, the temporary elements being arranged in a periodic pattern comprising at least two periodic subsections having different element characteristics from one another, wherein the element characteristics comprise at least one of: width or height,
   the step of depositing onto the substrate a first deposition layer comprising inorganic materials having a refractive index higher than 1.7, so as to at least partially cover the temporary elements with the first deposition layer, and
   the step of removing the temporary elements from the substrate in order to form onto the substrate a modulated diffractive grating of first grating elements made of the first deposition layer, the grating comprising within each periodic subsection of a plurality of first grating elements and one or more gaps between the first grating elements, and
   the step of depositing onto the substrate a second deposition layer after removing the temporary elements in order to at least partially fill said gaps within each periodic subsection of the periodic pattern to form a plurality of second grating elements.

2. The method according to claim 1, wherein the first deposition layer and second deposition layer are deposited using the same deposition material.

3. The method according to claim 1, wherein the temporary elements are line elements for forming a line grating as said diffractive grating.

4. The method according to claim 1, wherein said at least two periodic subsections having different element characteristics comprise elements having different widths and/or numbers, whereby a fill factor-modulated diffractive grating is formed.

5. The method according to claim 1, wherein said at least two periodic subsections having different element characteristics comprise elements having different heights, whereby a height-modulated diffractive grating is formed.

6. The method according to claim 1, wherein the first deposition layer is a conformal layer.

7. The method according to claim 1, further comprising anisotropically removing, an even layer of the first deposition layer from the substrate after depositing said first deposition layer in order to expose said temporary elements.

8. The method according to claim 1, wherein, when depositing the second deposition layer, the gaps between the first grating elements are entirely filled.

9. The method according to claim 1, further comprising anisotropically removing, an even layer of the second deposition layer from the substrate after depositing said second deposition layer.

10. The method according to claim 1, wherein the first deposition layer is deposited using atomic layer deposition (ALD), chemical vapor deposition (CVD) or physical vapor deposition (PVD).

11. The method according to claim 1, wherein the temporary elements are manufactured by embossing or lithography.

12. The method according to claim 1, wherein temporary elements are entirely removed by selective etching.

13. The method according to claim 1, wherein the first deposition layer is made of inorganic transparent material.

14. The method according to claim 1, wherein the substrate is an optically transparent substrate.

15. The method according to claim 1, wherein the first deposition layer has an index of refraction higher than that of the substrate material.

16. The method according to claim 1, wherein the area of the diffractive grating manufactured is at least 1 cm² and the period of the pattern 10 µm or less.

17. The method according to claim 1, wherein the grating manufactured comprises a plurality of zones with different average fill ratios of said grating elements.

18. The method according to claim 1, wherein a diffractive grating for an out-coupling grating, an in-coupling grating or an exit pupil expander of a near-to-eye display or head-up display is manufactured.

19. A modulated optically diffractive grating comprising:
at least two adjacent periodic subsections having different element characteristics comprising width and/or height, and
wherein the grating is manufactured using the method according to claim 1.

20. The grating according to claim 19, wherein said different dimensional characteristics comprise at least one of the following: different grating element width, different grating element height.

21. The grating according to claim 19, further comprising within each subsection of the periodic pattern at least three of the second grating elements at least one of which is arranged between two of the first grating elements and at least two of which are arranged on opposite lateral sides of one of the first grating elements, the first and second grating elements being made of the same or different materials and forming a single unified grating element within each subsection, and the grating comprising at least two adjacent subsections comprising unified grating elements with said different dimensional characteristics.

22. The grating according to claim 19, wherein the grating is an in-coupling grating, exit pupil expander grating or out-coupling grating of a diffractive waveguide display.

* * * * *